(12) United States Patent
Huang et al.

(10) Patent No.: US 11,955,770 B2
(45) Date of Patent: Apr. 9, 2024

(54) LASER DIODE ASSEMBLY AND DRIVING CIRCUIT FOR HIGH POWER SHORT PULSE GENERATION

(71) Applicant: Lumentum Operations LLC, San Jose, CA (US)

(72) Inventors: Hao Huang, San Jose, CA (US); Mikhail Dolganov, Gilroy, CA (US); Huanlin Zhu, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 334 days.

(21) Appl. No.: 17/301,332

(22) Filed: Mar. 31, 2021

(65) Prior Publication Data

US 2022/0209494 A1 Jun. 30, 2022

Related U.S. Application Data

(60) Provisional application No. 63/131,184, filed on Dec. 28, 2020.

(51) Int. Cl.
| | |
|---|---|
| *H01S 3/00* | (2006.01) |
| *H01S 5/02345* | (2021.01) |
| *H01S 5/026* | (2006.01) |
| *H01S 5/042* | (2006.01) |
| *H01S 5/068* | (2006.01) |
| *H01S 5/183* | (2006.01) |

(52) U.S. Cl.
CPC ........ *H01S 5/0428* (2013.01); *H01S 5/02345* (2021.01); *H01S 5/0261* (2013.01); *H01S 5/06825* (2013.01); *H01S 5/183* (2013.01)

(58) Field of Classification Search
CPC .. H01S 5/0428; H01S 5/02345; H01S 5/0261; H01S 5/06825; H01S 5/183; H01S 5/423
See application file for complete search history.

(56) References Cited

U.S. PATENT DOCUMENTS

| | | | |
|---|---|---|---|
| 2003/0016711 A1 | 1/2003 | Crawford | |
| 2017/0085057 A1* | 3/2017 | Barnes | H01S 5/0428 |
| 2022/0059983 A1* | 2/2022 | Dolganov | H01S 5/4018 |
| 2022/0209494 A1* | 6/2022 | Huang | H01S 5/0428 |
| 2022/0376470 A1* | 11/2022 | Nakakohara | G01S 17/42 |

* cited by examiner

*Primary Examiner* — Kinam Park
(74) *Attorney, Agent, or Firm* — Harrity & Harrity, LLP

(57) ABSTRACT

A driver circuit may include a source, a first circuit path, and a second circuit path. The a first circuit path may be connected to the source and include a first anode pad, a first set of connecting elements to connect the first anode pad to an anode of an optical load, a second anode pad that is separate from the first anode pad, a second set of connecting elements to connect the anode of the optical load to the second anode pad, and a switch. The switch being in a closed state causes current to charge the first set of connecting elements and the second set of connecting elements through the first circuit path. The switch transitioning from the closed state to the open state causes the first set of connecting elements to discharge current through the second circuit path to provide an electrical pulse to the optical load.

20 Claims, 16 Drawing Sheets

PRIOR ART

LASER DIODE ASSEMBLY AND DRIVING CIRCUIT FOR HIGH POWER SHORT PULSE GENERATION

CROSS-REFERENCE TO RELATED APPLICATION

This Patent Application claims priority to U.S. Provisional Patent Application No. 63/131,184, filed on Dec. 28, 2020, and entitled "LASER DIODE ASSEMBLY AND DRIVING CIRCUIT DESIGN FOR HIGH POWER SHORT PULSE GENERATION." The disclosure of the prior Application is considered part of and is incorporated by reference into this Patent Application.

TECHNICAL FIELD

The present disclosure relates generally to a driver circuit for optical loads and, more particularly, to a driver circuit for fast switching of an optical load to generate high peak power optical pulse with a reduced pulse width.

BACKGROUND

An optical system, such as a time-of-flight (ToF)-based measurement system, requires high power optical pulses of short duration (e.g., 10 nanoseconds (ns) or less). High power optical pulses may enable greater distance range finding. Shorter duration optical pulses may enable improved resolution. For a laser-based optical load (e.g., a laser diode, a semiconductor laser diode, a vertical-cavity surface-emitting laser (VCSEL), and/or the like), a higher electrical current across the optical load corresponds to a higher power optical pulse. In general, a ToF-based measurement system determines distances to objects by measuring delays between an emitted optical pulse and a reflected optical pulse. Emitted pulses having a well-defined origin in time, and a rectangular shape simplifies the measurements. To achieve such a rectangular shape, emitted optical pulses should have short rise times (e.g., a time during which power of the optical pulse is rising from zero to peak power) and short fall times (e.g., a time during which power of the optical pulse is falling from peak power to zero).

SUMMARY

In some implementations, a driver circuit includes a source; a ground; a first circuit path connected to the source, the first circuit path including: a first anode pad, a first set of connecting elements to connect the first anode pad to an anode of an optical load, a second anode pad, the second anode pad being separate from the first anode pad such that the second anode pad is not directly connected to the first anode pad, a second set of connecting elements to connect the anode of the optical load to the second anode pad, and a switch having an open state and a closed state, wherein the switch being in the closed state is to cause current to charge the first set of connecting elements and the second set of connecting elements through the first circuit path; and a second circuit path to connect to the optical load, the second circuit path being connected to the source, the second circuit path including: the optical load, the first anode pad, and the first set of connecting elements, wherein the switch transitioning from the closed state to the open state is to cause the first set of connecting elements to discharge current through the second circuit path to provide an electrical pulse to the optical load.

In some implementations, an optical package includes a source to provide a current; an optical load to emit light when provided an input current; a first circuit path connected to the source, the first circuit path including: a plurality of anode pads, each anode pad of the plurality of anode pads being separate from at least one other anode pad of the plurality of anode pads, a plurality of sets of connecting elements, each set of connecting elements connecting a different anode pad of the plurality of anode pads to an anode of the optical load; a switch having an open state and a closed state, wherein the switch being in the closed state is to cause current to charge the plurality of sets of connecting elements through the first circuit path; and a second circuit path to connect to the optical load, the second circuit path being connected to the source, the second circuit path including: the optical load, at least one anode pad of the plurality of anode pads, and at least one set of connecting elements of the plurality of sets of connecting elements, wherein the switch transitioning from the closed state to the open state is to cause the at least one set of connecting elements to discharge current through the second circuit path to provide an electrical pulse to the optical load.

In some implementations, a method includes charging, with a source, a plurality of sets of connecting elements by closing, for a first time interval, a switch to provide current through a first circuit path to the plurality of sets of connecting elements, wherein a first set of connecting elements of the plurality of sets of connecting elements connects a first anode pad to an anode of an optical load, and wherein a second set of connecting elements of the plurality of sets of connecting elements connects a second anode pad to the anode of the optical load, the second anode pad being separate from the first anode pad; and driving the optical load by opening, for a second time interval after the first time interval, the switch to discharge current from the first set of connecting elements through a second circuit path to provide an electrical pulse to the optical load.

DETAILED DESCRIPTION

The following detailed description of example implementations refers to the accompanying drawings. The same reference numbers in different drawings may identify the same or similar elements.

Figure 1A:
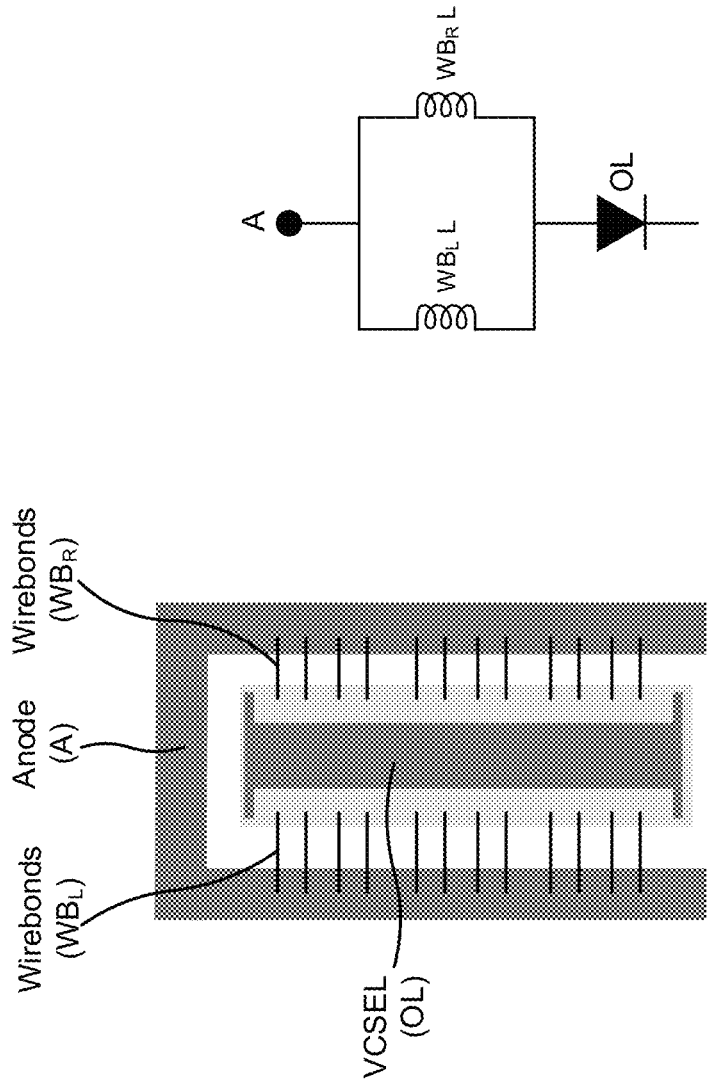
FIGS. 1A-1C are diagrams of prior driver circuits for driving optical loads.

A circuit for driving an optical load (referred to as a driver circuit) is a set of electronic components interconnected by current-carrying conductors (e.g., traces), or in many cases, is in the form of an integrated circuit where the components may be fabricated using semiconductors, such as silicon (Si), gallium nitride (GaN), or an mix of different semiconductors. Generally, it is desirable to switch the optical load in a fast, simple, and efficient way, as well as to generate a high peak power optical pulse while keeping a pulse width as small as possible. A significant challenge to quickly switch an optical load with high peak current is parasitic inductance. As an example, for a typical top-illuminating VCSEL chip, multiple bonding wires are used to connect a VCSEL anode with a pad of a driver circuit on a board of a substrate. A significant portion of parasitic inductance in the driver circuit results from these relatively thin and long bonding wires. In some cases, multiple bonding wires can be used on one or more sides of the VCSEL chip, with all of the bonding wires being connected in parallel in order to reduce a total inductance. FIG. 1A is a diagram of an example VCSEL assembly in which multiple wirebonds are on two sides of the VCSEL chip, with all of the wirebonds being connected in parallel. In FIG. 1A, the VCSEL assembly is shown on the left and the equivalent circuit is shown on the right. The inductors labeled $WB_L$ L and $WB_R$ L in the right portion of FIG. 1A represent the inductance of the wirebonds $WB_L$ and $WB_R$, respectively. Notably, in the configuration shown in FIG. 1A, parasitic inductance of the wirebonds is still a major limiting factor for switching and pulse generation performance.

Figure 1B:
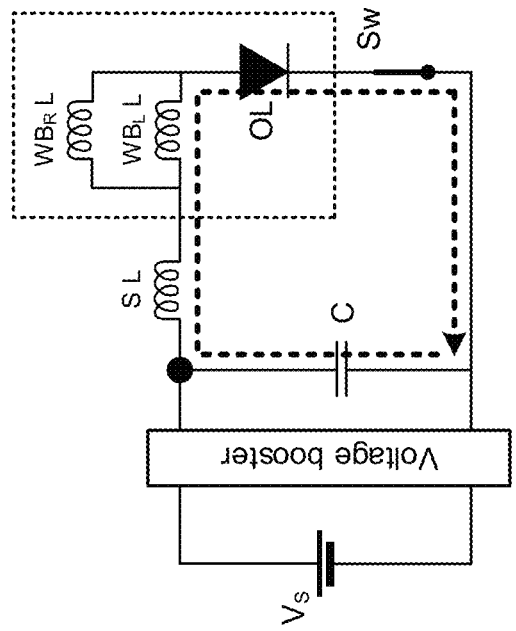

One technique to achieve fast switching in the presence of strong parasitic inductance is to increase voltage of a source. In such a case, a voltage booster (e.g., a direct current (DC)-DC voltage converter) can be used to increase an input voltage from a source (e.g., in the range of 5 volts (V) to 12 V) to a higher voltage (e.g., more than 100 V). FIG. 1B is a diagram of an example driver circuit including a voltage booster to increase voltage of a source Vs. In operation of the driver circuit in FIG. 1B, energy is stored in the capacitor C while the Sw is in an open state (i.e., off). As shown in FIG. 1B, at the time the switch Sw transitions to a closed state (i.e., on) at a rising edge of a trigger signal, the energy stored in the capacitor C is released and generates a short pulse to the optical load OL. Drawbacks of this technique include (1) a need for a voltage booster, which increases size, cost, and complexity of the optical package, and (2) that the wirebond inductance (stored by $WB_L$ L and $WB_R$ L) still exists in the current loop. This wirebond inductance is a limiting factor, meaning that a minimum pulse width and a peak current that can be achieved are still limited by the wirebond inductance. In FIG. 1B, S L represents stray inductance of the current loop, including the equivalent serial inductance of the capacitor C, and a trace of an anode pad.

Figure 1C:
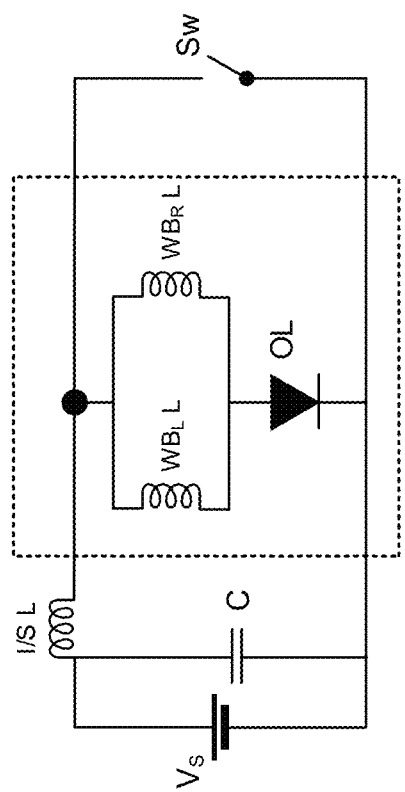

Another technique that can be used to achieve fast switching is to use a so-called pre-charging technique, an example driver circuit for which shown in FIG. 1C. Notably, in the driver circuit shown in FIG. 1C, no voltage booster is needed, and a DC voltage source Vs and decoupling capacitor C can provide a stable voltage to the circuit. The inductor I/S L can include a component with a designed inductance value and/or a stray inductance (e.g., inductance of a trace). As shown, the optical load OL and the switch Sw are connected in parallel. In operation, at the time when a trigger pulse transitions the switch Sw to a closed state, current flows through the inductor I/S L and the switch Sw, but no current, or very minimal current, flows through the optical load OL. During the time period that the switch Sw is in the closed state, the inductor I/S L is charged and energy is stored in the inductor I/S L. At the time when the switch Sw transitions to the open state at the falling edge of the trigger signal, the energy stored by the inductor I/S L will be released and will push the current through the optical load OL. As compared to the technique used in FIG. 1B, the technique used in FIG. 1C eliminates the use of a voltage booster and simplifies the circuit, and removes the limitation of the parasitic inductance I/S L. However, the wirebond parasitic inductance (i.e., $WB_L$ L, and $WB_R$ L) is still in the current loop and remains a limiting factor.

Some implementations described herein provide an optical package that includes a driver circuit and an optical load configured such that a limitation imparted by parasitic inductance is mitigated (e.g., when generating high peak power and narrow pulse with optical pulses). In some implementations, the optical chip is wirebond to the driver circuit and the driver circuit includes multiple, separate anodes in a pre-charging configuration. In some implementations, the driver circuit includes a source, a ground, a first circuit path, and a second circuit path. In some implementations, the first circuit path is connected to the source and includes a first anode pad, a first set of wirebonds to connect the first anode pad to an anode of an optical load, a second anode pad, a second set of wirebonds to connect the anode of the optical load to the second anode pad, and a switch. Here, the second anode pad is separate from the first anode pad such that the second anode pad is not directly connected to the first anode pad (e.g., the second anode pad may be indirectly connected to the first anode pad through the first set of wirebonds, the anode of the optical load, and the second set of wirebonds). In some implementations, the switch being in a closed state is to cause current to charge the first set of wirebonds and the second set of wirebonds through the first circuit path. In some implementations, the second circuit path is to connect to the optical load, is connected to the source, and includes the first anode pad, the first set of wirebonds, and the optical load. In some implementations, the switch transitioning from the closed state to an open state is to cause the first set of wirebonds to discharge current through the second circuit path to provide an electrical pulse to the optical load. Additional details are provided below.

Notably, while the examples described herein are described in the context of wirebonding, the techniques described herein are applicable to other types connecting elements. In general, the types of connecting elements to which the techniques described herein may be applied include any type of connecting element associated with a connection between an optical load and a driver circuit, such as a wirebond, a bond pad, a metal trace, a via, or another type of element that is used to supply current to a laser or an optical load.

In some implementations, the optical package and the driver circuit described herein mitigate a limitation imparted by parasitic inductance when generating high peak power and narrow pulse width optical pulses. As described in further detail below, the mitigation of the limitation of parasitic capacitance is achieved by utilizing a portion of wirebond inductance for generation of an optical pulse. As one example, with a voltage source of 4 V, the driver circuit can be used to drive a VCSEL chip that provides an optical pulse with a 1.87 ns pulse width at 275 watts (W) of peak optical power. Further, the optical package and the driver circuit described herein improve total power efficiency (i.e., a ratio of average optical power over total electrical input power) as compared to prior solutions. Additionally, the optical package and the driver circuit described herein have a reduced size, cost, and/or complexity as compared to prior solutions (e.g., since only a single switch and a single trigger signal are needed, and since no voltage booster is needed).

Figure 2A:
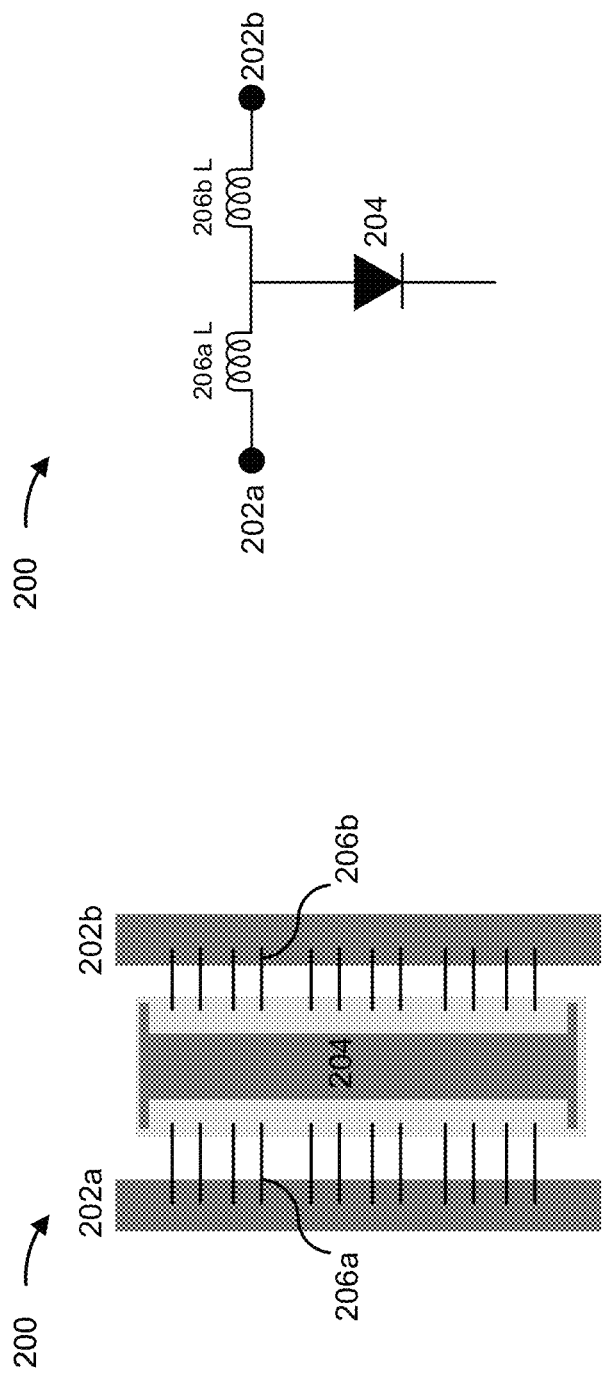
FIGS. 2A and 2B are diagrams illustrating an implementation of an example optical load layout and driver circuit described herein.
Figure 2B:
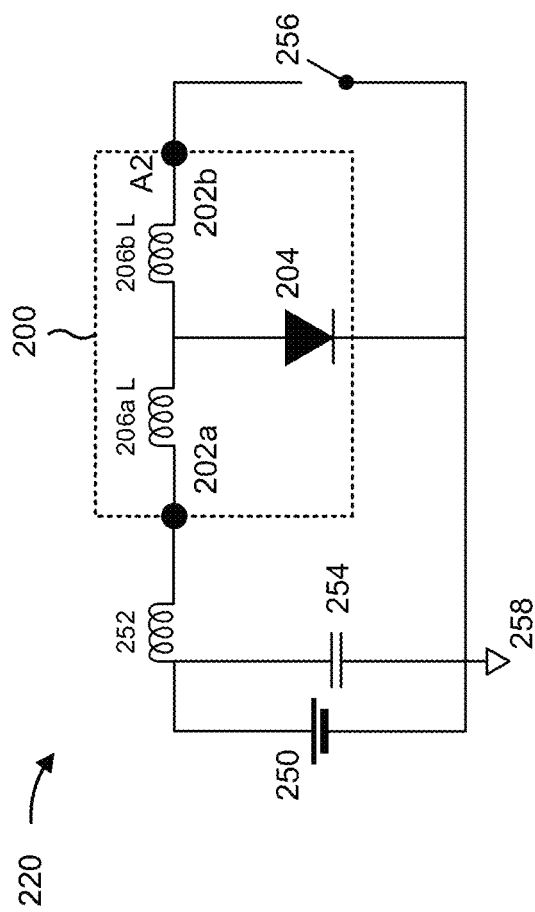

FIGS. 2A and 2B are diagrams illustrating an implementation of an example optical load layout 200 and an example driver circuit 220 that includes the optical load layout 200, respectively. With reference to FIG. 2A, the left diagram is a schematic diagram of the optical load layout 200, and the right diagram is an equivalent circuit of the optical load layout 200 shown in the left diagram of FIG. 2A. As shown in the left diagram of FIG. 2A, the optical load layout 200 utilizes multiple (e.g., two or more) anode pads 202 (e.g., a pad 202a and a pad 202b), an optical load 204, and multiple sets of wirebonds 206 (e.g., a set of wirebonds 206a and a set of wirebonds 206b). With reference to the right diagram of FIG. 2A, the inductors labeled 206a L and 206b L represent the inductance of the wirebonds 206a and the wirebonds 206b, respectively.

The pads 202 (e.g., the pad 202a and the pad 202b) are anode pads associated with connecting an anode of the optical load 204 to the driver circuit 220. In some implementations, the pads 202 include separate anode pads. That is, in some implementations, each pad 202 is separated from at least one other pad 202 such that a given pad 202 is not electrically connected to at least one other pad 202 through a pad trace. For example, in the case of pads 202a and 202b, the pad 202a and the pad 202b are not electrically connected through the pad trace, but are connected only through the wirebonds 206 (e.g., through a connection provided by the wirebonds 206a, the anode of the optical load 204, and the wirebonds 206b). Put another way, the pad 202a and the pad 202b are not directly connected. Such separation of the pads 202 with connection through the wirebonds 206 enables current to flow through the pad 202a, the wirebonds 206a, the anode of the optical load 204, the wirebonds 206b, and the pad 202b. In some implementations, as described below, the pads 202 including separate anode pads enables inductance of one or more sets of wirebonds 206 to be useful inductance for the purpose of driving the driver circuit 220.

Notably, while the optical load layout 200 is illustrated as including two separate pads 202 arranged on opposite sides of the optical load 204, in some implementations, an optical load layout may include more than two pads 202 (e.g., three pads 202, six pads 202, eight pads 202, or the like) or differently arranged pads 202 than shown in the optical load layout 200 of FIG. 2A. Examples of optical load layouts including different numbers and different arrangements of pads 202 are described below with respect to FIGS. 5-8.

The optical load 204 is an optical load to be driven by the driver circuit 220. In some implementations, the optical load 204 may include a laser diode, such as a VCSEL (e.g., an optical chip including one or more arrays of individual emitters). In some implementations, the optical load 204 includes a single junction laser diode (e.g., a single junction VCSEL). In some implementations, the optical load 204 includes a multi junction laser diode (e.g., a multi-junction VCSEL). In some implementations, the optical load 204 includes one or more addressable zones. For example, in some implementations, the optical load 204 may include multiple independently addressable zones of individual emitters. In some implementations, a threshold voltage of the optical load 204 may be higher than a voltage level of a source (e.g., a source 250, as shown in FIG. 2B) of the driver circuit 220.

The wirebonds 206 (e.g., the wirebonds 206a and the wirebonds 206b) are bonding wires that electrically connect the pads 202 to an anode of the optical load 204. In some implementations, as described below, inductance of at least one set of wirebonds 206 may be useful inductance, meaning that the inductance of the at least one set of wirebonds 206 can be used in association with driving the optical load 204.

FIG. 2B is a circuit diagram of the driver circuit 220 that incorporates the optical load layout 200 shown in FIG. 2A. As shown in FIG. 2B, in addition to the optical load layout 200, the driver circuit 220 includes a source 250, an inductive element 252, a capacitor 254, a switch 256, and a ground 258.

The source 250 is an element capable of providing current to the driver circuit 220 in association with driving the optical load 204. For example, the source 250 may be a DC voltage source, a DC current source with a resistive load, and/or the like.

The inductive element 252 includes one or more inductive elements of the driver circuit 220. For example, the inductive element 252 may be an inductor with a designed inductance value. As another example, the inductive element 252 may be one or more other elements of the driver circuit 220 with an inductance (e.g., such that the inductance of the inductive element 252 represents the inductance of the one or more other elements). The one or more other elements may include, for example, one or more current-carrying conductors in the driver circuit 220, one or more traces of one or more of the pads 202, the capacitor 254, the switch 256, or stray inductance in the driver circuit 220. As another example, the inductive element 252 may include both an inductor with a designed inductance and one or more other elements of the driver circuit 220 (e.g., such that the inductance of the inductive element 252 represents the total inductance of the inductor and the one or more other elements). In some implementations, some portion of the inductance of the inductive element 252 may be useful inductance, meaning that some portion of the inductance of the inductive element 252 can be used in association with driving the optical load 204.

The capacitor 254 is an element that provides voltage stabilization for the driver circuit 220. For example, the capacitor 254 may be a decoupling capacitor that stabilizes the voltage of the source 250 such that the driver circuit 220 is provided a stable voltage for the driving of the optical load 204.

The switch 256 is an element used to charge and discharge one or more elements of the driver circuit 220 in association with driving the optical load 204. For example, the switch 256, when in a closed state, may cause the one or more elements of the driver circuit 220 to be charged (e.g., accumulate stored energy) by a current in the driver circuit 220 and, when in an open state, may cause the one or more elements to discharge stored energy such that an electrical pulse is provided to the optical load 204. Notably, the switch 256 is the only switch in the driver circuit 220 associated with driving the optical load 204 (i.e., no other switches are needed in association with driving of the optical load 204 by the driver circuit 220), meaning that cost, size, or complexity of the driver circuit 220 may be reduced (e.g., as compared to a prior driver circuit that requires at least two switches).

In some implementations, the driver circuit 220 includes a first circuit path and a second circuit path. The first circuit path is connected to the source 250 and includes the inductive element 252, the pad 202a, the wirebonds 206a, the wirebonds 206b, the pad 202b, and the switch 256. In some implementations, as described below, the switch 256 being in a closed state causes current to charge the inductive element 252, the wirebonds 206a, and the wirebonds 206b through the first circuit path.

The second circuit path is a path to connect to the optical load 204, is connected to the source 250, and includes the inductive element 252, the pad 202a, the wirebonds 206a, and the optical load 204. In some implementations, as described below, the switch 256 transitioning from the closed state to the open state causes the wirebonds 206a to discharge current through the second circuit path to provide an electrical pulse to the optical load 204. Similarly, in some implementations, the switch 256 transitioning from the closed state to the open state causes the inductive element 252 to discharge stored energy (e.g. current) through the second circuit path to provide the electrical pulse to the optical load 204.

As indicated above, FIGS. 2A and 2B are provided as examples. Other examples may differ from what is described with regard to FIGS. 2A and 2B.

Figure 3A:
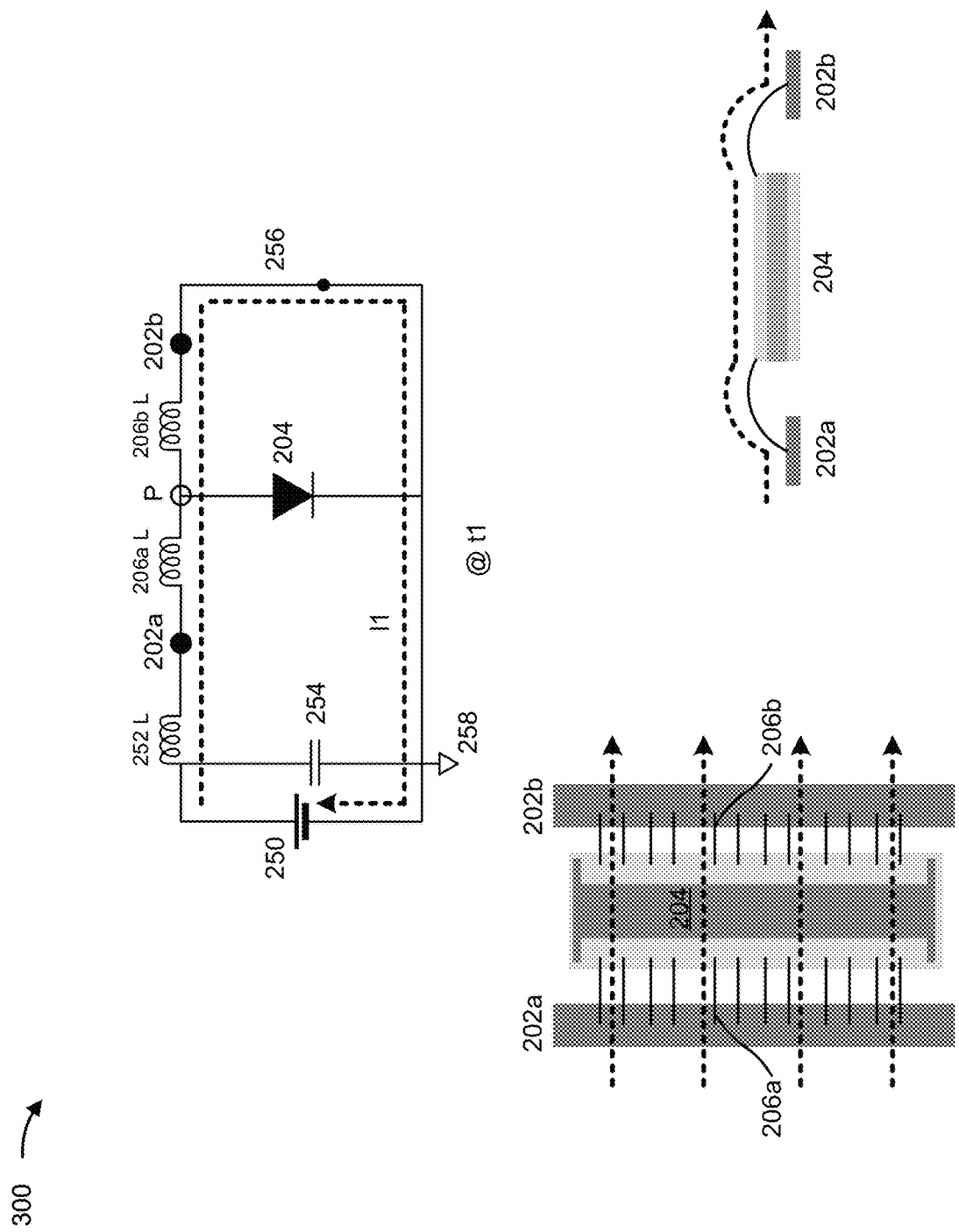
FIGS. 3A-3C are diagrams illustrating an example operation of the driver circuit that utilizes the optical load layout described herein.
Figure 3B:
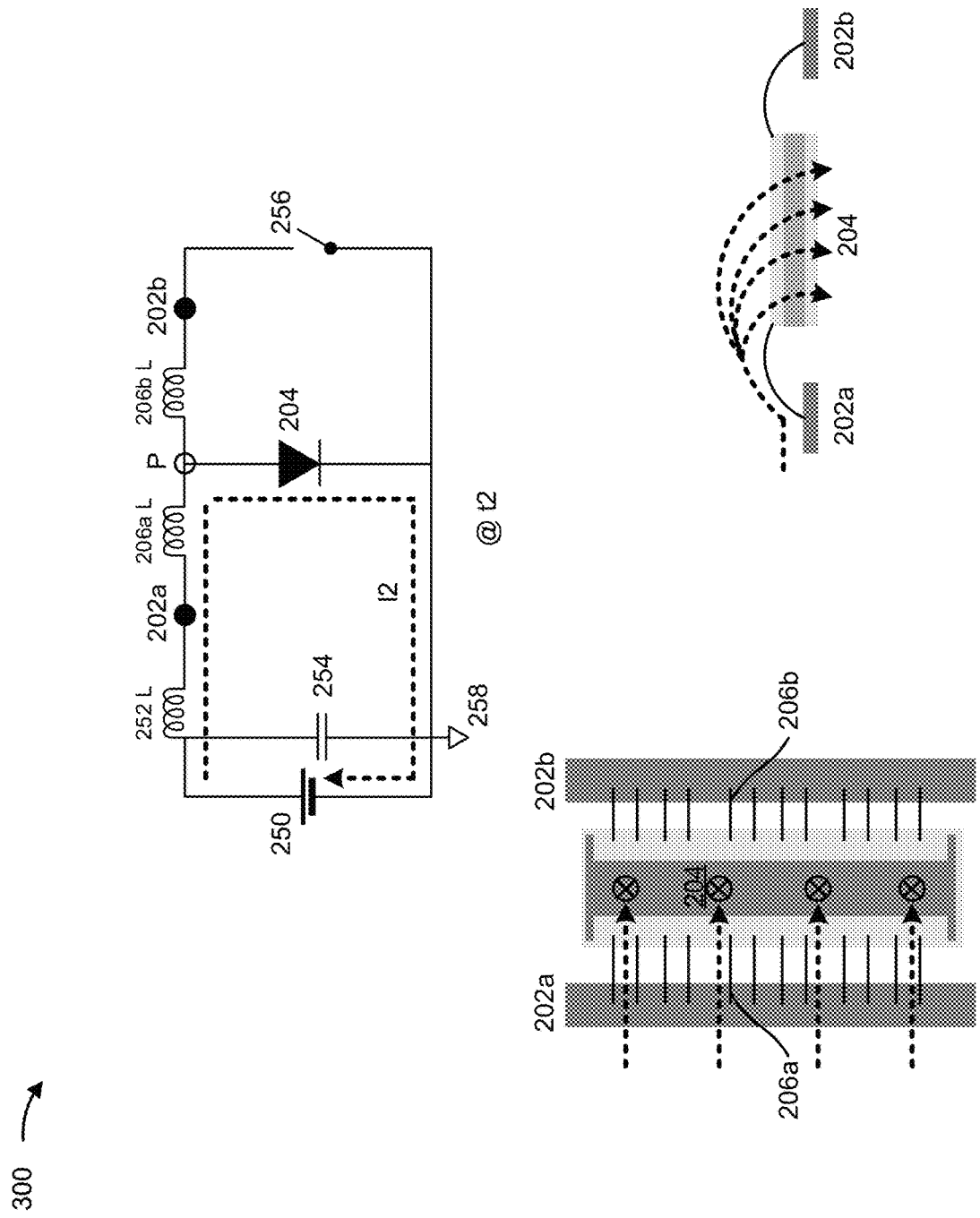
Figure 3C:
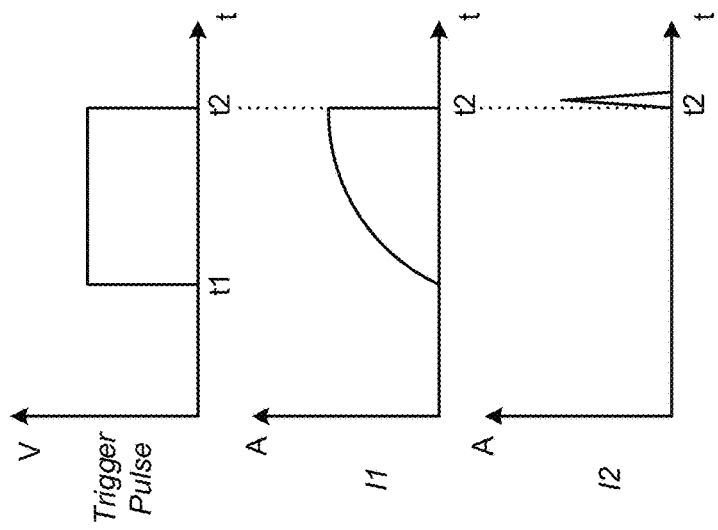

FIGS. 3A-3C are diagrams illustrating an example operation 300 of the driver circuit 220 that utilizes the optical load layout 200. With reference to FIG. 3A, at time t1, which corresponds to a rising edge of a trigger pulse, the switch 256 is in a closed state, and current starts to flow along the first circuit path I1 (e.g., from the pad 202a through the wirebonds 206a, the anode of the optical load 204, and the wirebonds 206b to the pad 202b). Here, during the pre-charging time period (e.g., between the time t1 and a time t2, which corresponds to a falling edge of the trigger pulse), current increases relatively slowly due to inductance of the inductive element 252, the wirebonds 206 and other inductance (e.g., stray inductance or inductance of one or more other inductors in in the driver circuit 220) on the first circuit path I1. As the current increases, this inductance is charged, and energy is stored in the inductive element 252, the wirebonds 206a, and the wirebonds 206b.

Notably, during the pre-charging period (e.g., from time t1 to the time t2) there is no current, or minimal current, flowing through the optical load 204. In some implementations, the current flow through the optical load 204 is eliminated or minimized because the source 250 provides a voltage that is lower than a threshold voltage of the optical load 204. That is, in some implementations, a voltage level of the source 250 prevents current from flowing through the optical load 204 when the switch 256 is in the closed state. Prior pre-charging design may require at least two switches in order to prevent current flow through the optical load. However, in the driver circuit 220, the voltage of the source 250 is below the threshold voltage of the optical load 204 and, therefore, the driver circuit 220 only needs to include a single switch (e.g., switch 256), thereby reducing, size, cost, and complexity of the driver circuit 220. The need for the voltage of the source 250 to be lower than the threshold voltage may limit a maximum charging current. Therefore, an optical load 204 with a higher threshold may be desirable. Thus, in some implementations, the optical load 204 may include multiple junctions (e.g., since a voltage threshold of a multi-junction laser diode may be comparatively higher than that of a single junction laser diode). In such a case, the voltage of the source 250 and the maximum charging current can be increased, thereby improving performance of the driver circuit 220.

As shown in FIG. 3B, at the time t2, the switch 256 transitions from the closed state to an open state. Here, the energy stored in the inductive element 252 and the wirebonds 206a is released. Due to the nature of an inductor, the current flow will be maintained briefly, but the current is then forced to flow from the pad 202a through the optical load 204 to a cathode pad of the optical load 204. This generates a voltage spike at the point P at the anode side of the optical load 204. This voltage spike is higher than the threshold voltage of the optical load 204 and, therefore, the second circuit path I2 is formed and a narrow current pulse through the optical load 204 is generated.

FIG. 3C is a diagram illustrating timing of the trigger pulse, the current flow on the first circuit path I1, and the current flow on the second circuit path as described in the example shown in FIGS. 3A and 3B.

In this way, the optical load layout 200 and the driver circuit 220 can be utilized to enable inductance of the wirebonds 206a to become useful inductance. That is, since the wirebonds 206a store energy during the pre-charging time period while the switch 256 is in the closed state and, when the switch 256 transitions to the open state, the energy stored in the wirebonds 206a is released to the optical load 204. This use of energy stored by the wirebonds 206a provides an improved switch speed and efficiency, since this energy is released to the optical load 204 (e.g., since the energy is used for driving the optical load 204). The inductance of the inductive element 252 can be used in a similar manner to enable energy stored by the inductive element 252 to be used for driving the optical load 204. Consequently, the design requirements of the wirebonds 206a and 206b can be separated, so that the inductance of the wirebonds 206a provides a benefit to the optical load 204, while the inductance of wirebonds 206b may be reduced or minimized. Previously in the art, all wirebonds to an optical load from a common anode pad may have been designed the same (e.g., different groups of wirebonds were not designed separately).

Notably, while the techniques described herein, including this "separate design" principle, apply to the design of wirebonds connecting separate anode pads to an anode of an optical load (e.g., the wirebonds 206a and 206b connecting the pad 202a and the 202b, respectively, to the anode of the optical load 204), the techniques described herein are applicable to other types connecting elements for providing connections between an optical load and a driver circuit. As one example, in the case of a bottom-emitting VCSEL (e.g., where flip-chip bonding can be used such that wirebonds are not needed), the techniques described herein may be used for design of connecting elements that provide separate connections between the bottom-emitting VCSEL and a driver circuit. In this example, the connecting elements may include one or more bonding pads or one or more metal traces (e.g., one or more elements that enable flip-chip bonding of the bottom-emitting VCSEL chip). In general, the types of connecting elements to which the techniques described herein may be applied include any type of connecting element associated with a connection between an optical load and a driver circuit, such as a wirebond, a bond pad, a metal trace, a via, or another type of element that is used to supply current to a laser or an optical load. Each of these types of connecting elements have parasitic inductance the impact of which can be mitigated using the techniques described herein.

As indicated above, FIGS. 3A-3C are provided as an example. Other examples may differ from what is described with regard to FIGS. 3A-3C.

In some implementations, wirebonds 206 (e.g., wirebonds 206a and/or wirebonds 206b) can be designed so as to optimize performance in association with driving the optical load 204 by the driver circuit 220. For example, in some implementations, a characteristic (e.g., a length, a thickness, a material, a number of bonding wires, or the like) of the wirebonds 206a may be selected or designed such that an inductance of the wirebonds 206a causes an amount of energy stored by the wirebonds 206a, when the switch 256 is in the closed state, to satisfy a threshold (e.g., such that the amount of energy stored by the wirebonds 206a during the pre-charging time period is at or above a desired amount, is within a particular range, or the like). That is, in some implementations, the wirebonds 206a can be designed to have an inductance that allows a desirable amount of energy for driving the optical load 204 to be stored.

As another example, in some implementations, a characteristic of the wirebonds 206b may be selected or designed such that an inductance of the wirebonds 206b causes an amount of energy stored by the wirebonds 206b when the switch 256 is in the closed state to satisfy a threshold (e.g., such that the amount of energy stored by the wirebonds 206b during the pre-charging time period is below a desired amount, is within a particular range, or the like). That is, in some implementations, the wirebonds 206b can be designed so as to minimize inductance (e.g., since the energy stored by the wirebonds 206b may slightly degrade performance in association with the driving of the optical load 204 by the driver circuit 220).

In some implementations, the inductive element 252 can be designed so as to optimize performance in association with driving the optical load 204 by the driver circuit 220. For example, in some implementations, an inductive element with a designed inductance value (e.g., an inductor) may be used to provide a desired or optimal inductance value of the inductive element 252 in association with storing energy for driving the optical load 204. In some implementations, the design of inductive element 252 may be utilized in conjunction with the design of the wirebonds 206a in order to optimize performance in association with driving the optical load 204.

In some implementations, a relationship between inductance values of the wirebonds 206a, the wirebonds 206b, and the inductive element 252 may be selected according to a design process.

Figure 4:
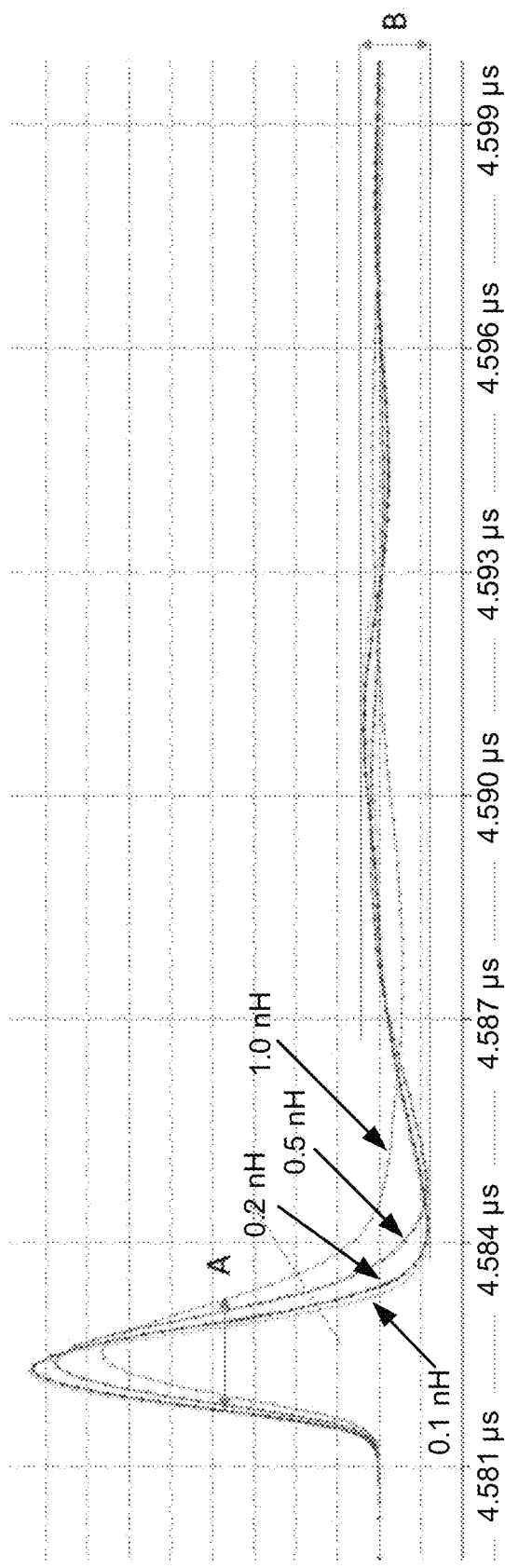
FIG. 4 is a diagram illustrating an example of waveforms generated with different inductance values for connecting elements used in the driver circuit described herein.

FIG. 4 is a diagram illustrating an example of waveforms generated with different inductance values for the wirebonds 206a (e.g., a value of 0.1 nanohenry (nH), a value of 0.2 nH, a value of 0.5 nH, and a value of 1 nH). In this example, the inductive element 252 has an inductance value of 0 nH (i.e., the total inductance value of the inductive element 252 and the wirebonds 206a is simulated using a single value—the inductance value for the wirebonds 206a). In the example illustrated in FIG. 4, parasitic inductance is 0.5 nH and inductance of the wirebonds 206b is 0.4 nH. The waveforms at each of these different wirebonds 206a inductance values illustrate a design trade-off. In general, a higher inductance value of the wirebonds 206a will result in a wider pulse (indicated by range A), but will have a smaller oscillation and, therefore, a smaller second pulse (indicated by range B). Conversely, a lower value inductance of the wirebonds 206a will generate a narrower pulse, but will have a larger oscillation and therefore, a stronger second pulse. The inductance value for the wirebonds 206a can be selected by considering the trade-off of both pulse width and strength of the second pulse.

As indicated above, FIG. 4 is provided as an example. Other examples may differ from what is described with regard to FIG. 4.

As described above, while the optical load layout 200 is described as including two separate pads 202 arranged on opposite sides of the optical load 204, in some implementations, an optical load layout used in the driver circuit 220 may include more than two pads 202 or differently arranged pads 202 than shown in the optical load layout 200. FIGS. 5-8 are diagrams of examples of optical load layouts including different numbers and different arrangements of pads 202.

Figure 5:
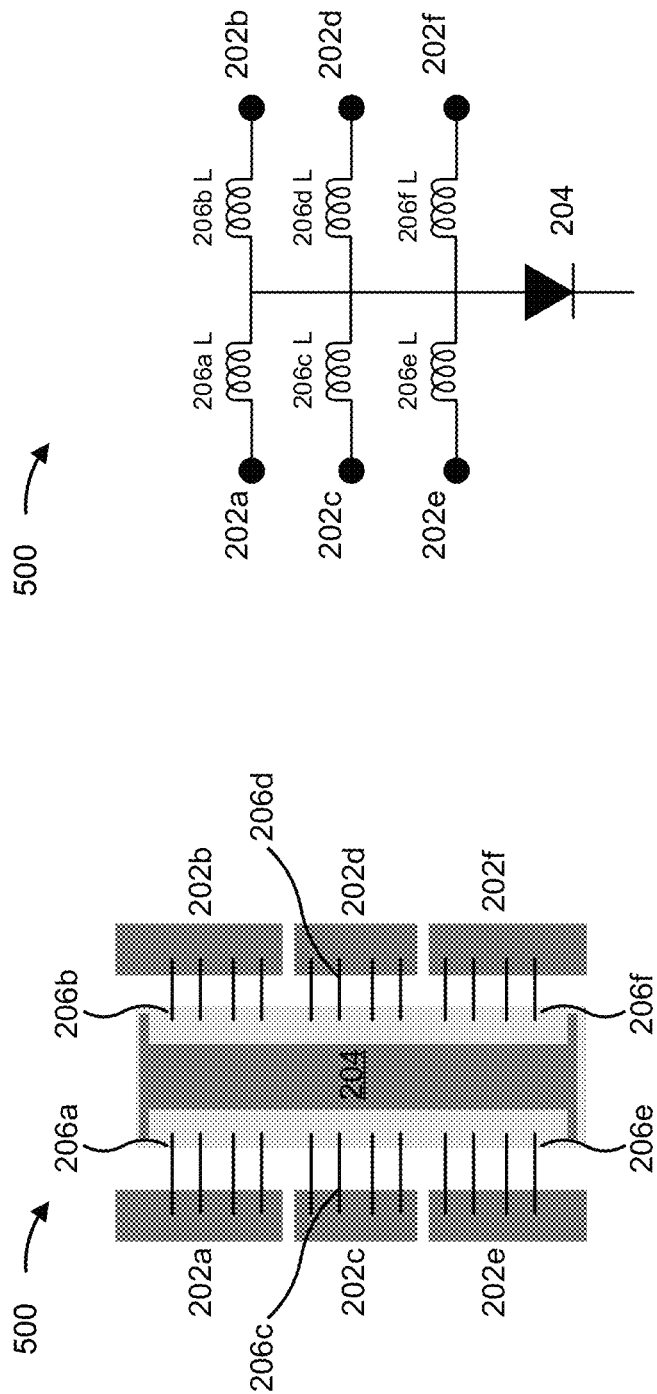
FIGS. 5-8 are diagrams illustrating implementations of other example optical load layouts described herein.

FIG. 5 includes diagrams associated with an optical load layout 500 that includes six pads 202 (e.g., pad 202a through 202f) each connected to an anode of the optical load 204 by a different set of wirebonds 206 (e.g., wirebonds 206a through 206f). The optical load layout 500 is schematically shown in the left portion of FIG. 5, while an equivalent circuit is shown in the right portion of FIG. 5. In the optical load layout 500, a first set of pads 202 is on a first side of the optical load 204 (e.g., pad 202a, pad 202c, and pad 202e are on a left side of the optical load 204), while a second set of pads 202 is on a second side of the optical load 204 (e.g., pad 202b, pad 202d, and pad 202f are on a right side of the optical load 204). In some implementations, an optical load layout with more than two pads 202, such as the optical load layout 500, increases flexibility to pair the optical load layout with the driver circuit 220. For example, the pad 202a, the pad 202c, and the pad 202e can used collectively as a first collective anode pad, and the pad 202b, pad 202d, and pad 202f can be used collectively as a second collective anode pad. Here, the first collective anode pad and the second collective anode pad are separate anode pads (i.e., not connected through a pad trace). In such a case, the equivalent circuit is similar to that of the optical load layout 200 shown in FIG. 2A. Alternatively, one or more pads 202 (e.g., the pad 202a and the pad 202c) could be used as a first collective anode pad, while the remaining pads 202 (e.g., pad 202b and pads 202d through 202f) could be used as the second collective anode pad. In some implementations, such flexibility provides an avenue for changing inductance of the wirebonds 206 used to store energy used to drive the optical load 204, and the inductance of the wirebonds 206 for which stored energy should be reduced or minimized. Notably, the optical load layout 500 may include a different number of anode pads (e.g., three, four, five, or more than six) than shown in FIG. 5.

Figure 6:
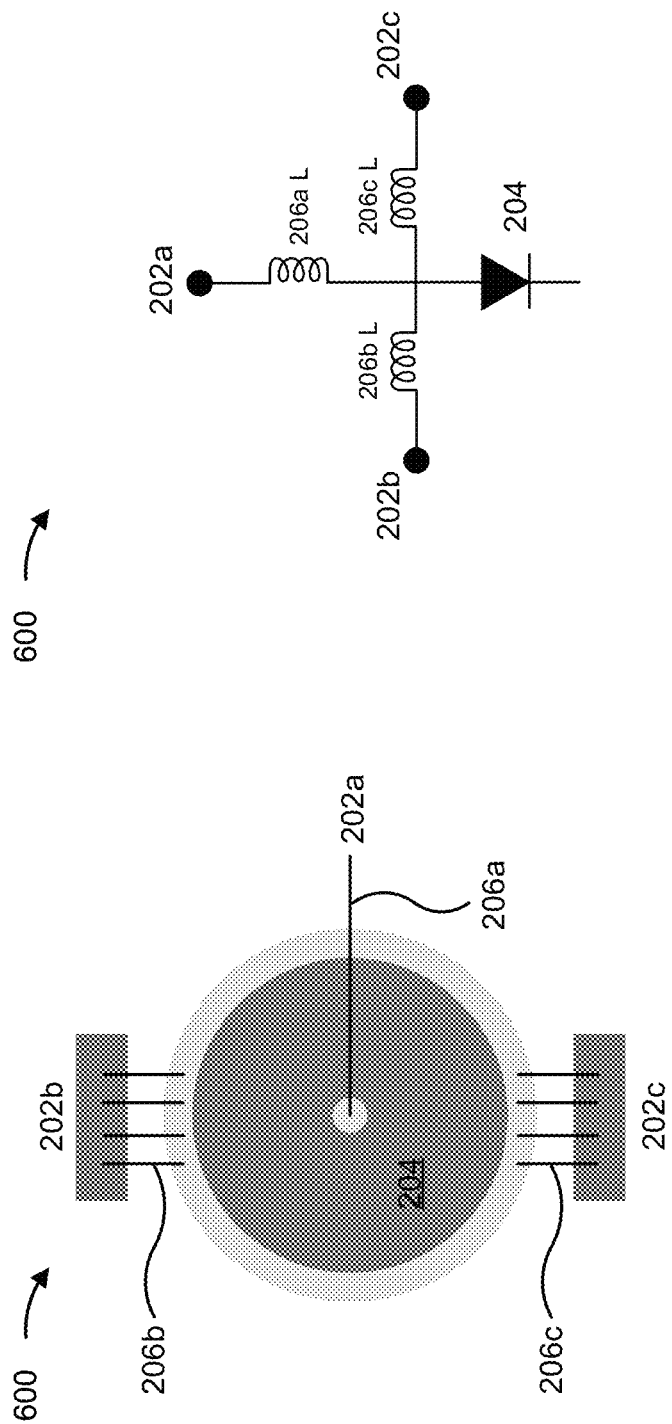

FIG. 6 includes diagrams associated with an optical load layout 600 that includes three pads 202 (e.g., pad 202a through 202c) arranged for connection to an optical load 204 with a circular shape. The optical load layout 600 is schematically shown in the left portion of FIG. 6, while an equivalent circuit is shown in the right portion of FIG. 6. In one example using the optical load layout 600, the pad 202a (e.g., connected by wirebonds 206a) may be used as a first anode pad, while the pads 202b and 202c (e.g., connected by wirebonds 206b and wirebonds 206c, respectively) may be used as a second (collective) anode pad. In this example, the first anode pad and the second collective anode pad are separate anode pads (i.e., not connected through a pad trace), and the inductance of the wirebonds 206a may be useful inductance for driving the optical load 204. Notably, the optical load layout 600 may include a different number of anode pads (e.g., three, four, five, or more than six) around the circular optical load 204 than shown in FIG. 6.

Figure 7:
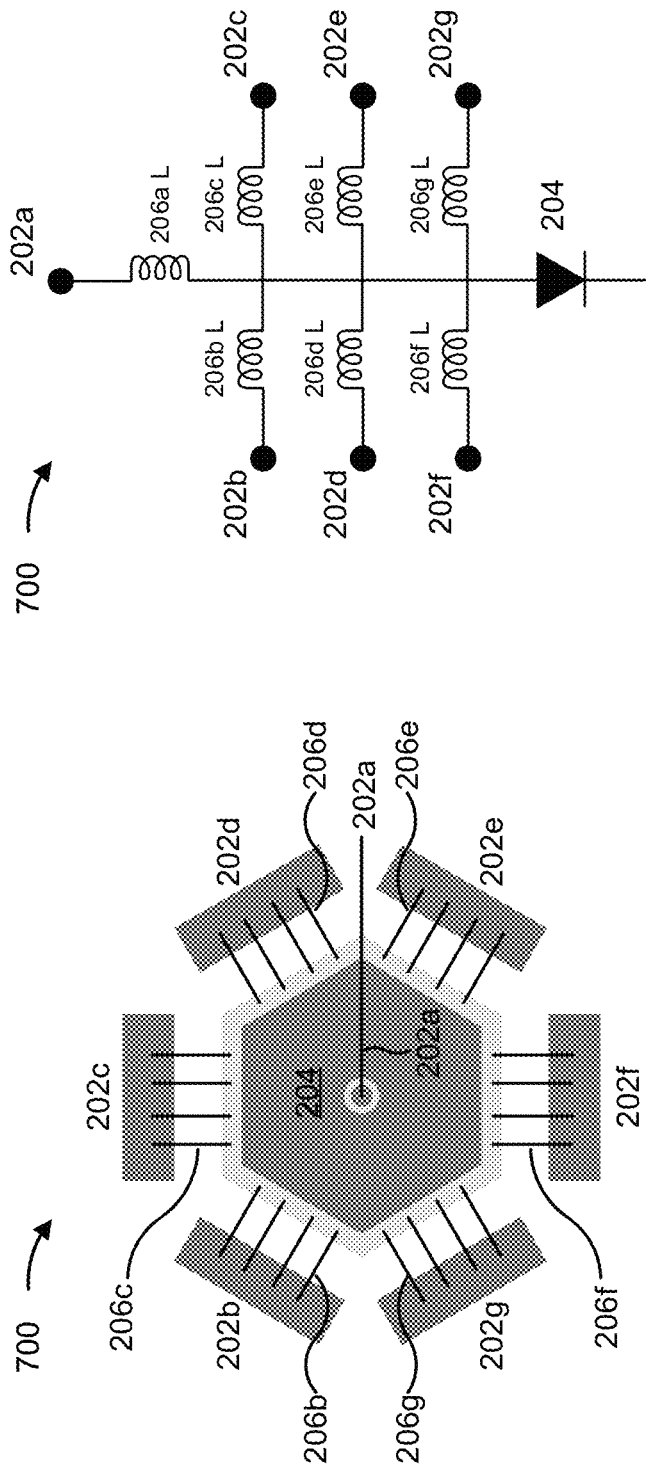

FIG. 7 includes diagrams associated with an optical load layout 700 that includes seven pads 202 (e.g., pad 202a through 202g) arranged for connection to an optical load 204 with a polygonal shape (e.g., a hexagonal shape). The optical load layout 700 is schematically shown in the left portion of FIG. 7, while an equivalent circuit is shown in the right portion of FIG. 7. In the optical load layout 600, the pad 202a (e.g., connected by wirebonds 206a) may be used as a first anode pad, while the pads 202b through 202g (e.g., connected by wirebonds 206b thorough 206g, respectively) may be used as a second (collective) anode pad. In this example, the first anode pad and the second collective anode pad are separate anode pads (i.e., not connected through a pad trace), and inductance of the wirebonds 206a may be useful inductance for driving the optical load 204. In some implementations, the optical load layout 700 provides flexibility in the manner described above in association with FIG. 5. Notably, the optical load layout 700 may include a different number of anode pads (e.g., three, four, five, or more than six) around the polygonal optical load 204 than shown in FIG. 7.

Figure 8:
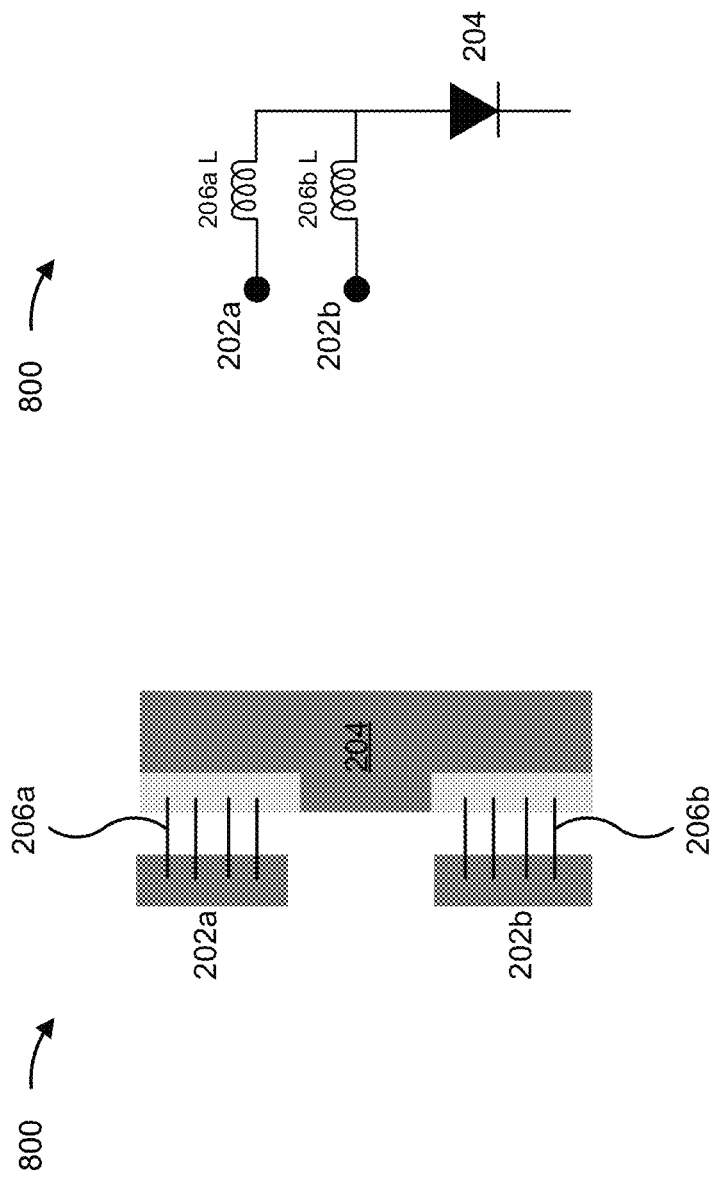

FIG. 8 includes diagrams associated with an optical load layout 800 that includes pads 202a and 202b on a same side of the optical load 204. The optical load layout 800 is schematically shown in the left portion of FIG. 8, while an equivalent circuit is shown in the right portion of FIG. 8. Here, the pad 202a (e.g., connected by wirebonds 206a) may be used as a first anode pad, while the pad 202b (e.g., connected by wirebonds 206b) may be used as a second anode pad (e.g., similar to the optical load layout 200). In this example, the first anode pad and the second anode pad are separate anode pads (i.e., not connected through a pad trace), and the inductance of the wirebonds 206a may be useful inductance for driving the optical load 204. Notably, the optical load layout 600 may include a different number of anode pads (e.g., three, four, five, or more than six) on the same side of the optical load 204 than shown in FIG. 8.

As indicated above, FIGS. 5-8 are provided as examples. Other examples may differ from what is described with regard to FIGS. 5-8. In general, the optical load layout used in the driver circuit 220 can be in a different form, have a different shape, or have different dimensions than those shown associated with the examples shown in FIGS. 5-8.

In some implementations, as noted above, the optical load 204 includes one or more independently addressable zones. For example, in some implementations, the optical load 204 may include multiple independently addressable zones of individual emitters.

Figure 9:
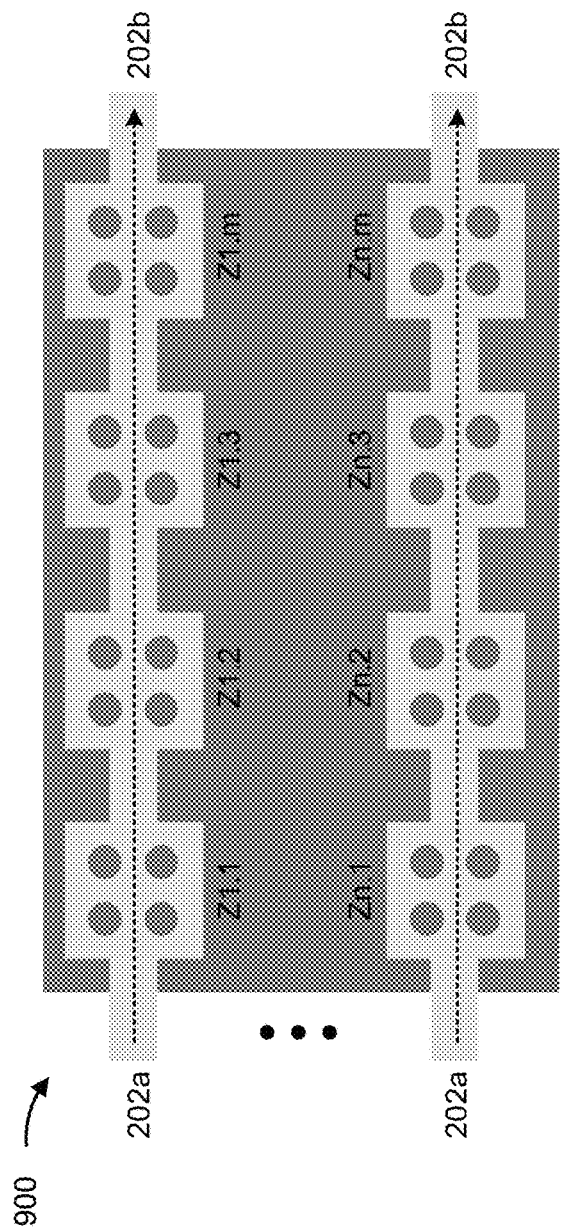
FIG. 9 is a diagram of illustrating an implementation of an optical load layout comprising multiple independently addressable zones described herein.
Figure 9:
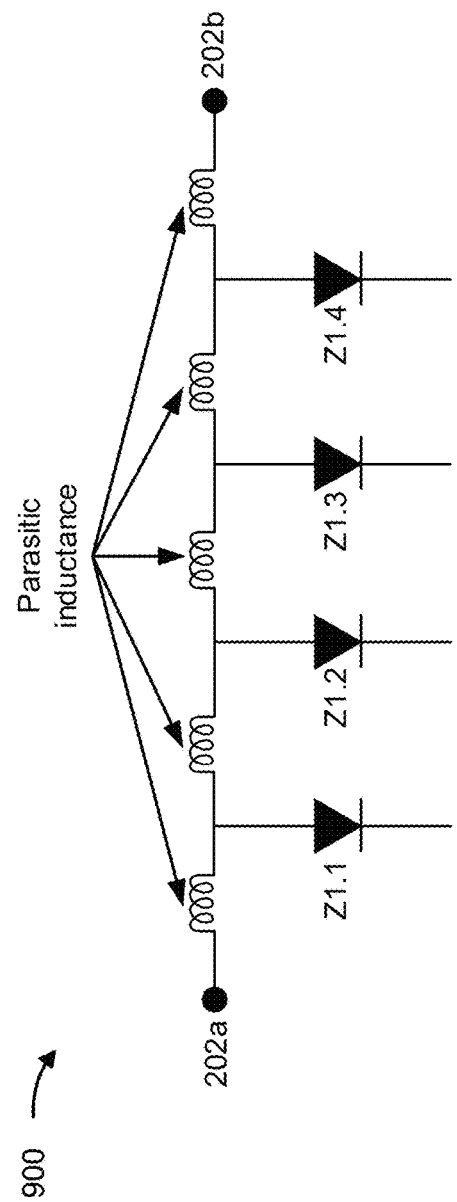

FIG. 9 includes diagrams associated with an optical load layout 900 that includes pads 202a and 202b associated with driving an optical load 204 with multiple independently addressable zones Z1.m (m>1) through Zn.m (n>1). The optical load layout 900 is schematically shown in the left portion of FIG. 9, while an equivalent circuit is shown in the right portion of FIG. 9. As indicated in FIG. 9, relatively long electrical paths may be present in the optical load 204. For example, an electrical path from an input (e.g., at the pad 202a) to a zone Zn.m may be relatively long (e.g., because the zone Zm.N is comparatively further away from an input than other zones of the optical load 204). As a result, parasitic inductance on the electrical path to the zone Zn.m (e.g., parasitic inductance inside the optical load 204) may be significant. However, if the optical load layout 900 is used in the driver circuit 220, then at least some portion of such inductance on the electrical path (e.g., some inductance between the pad 202a and the zone Zn.m) can be used for pre-charging, meaning that the portion of the inductance can be used for driving the optical load 204. In this way, performance and efficiency for an optical load 204 including multiple addressable zones can be improved.

As indicated above, FIG. 9 is provided as an example. Other examples may differ from what is described with regard to FIG. 9.

Figure 10:
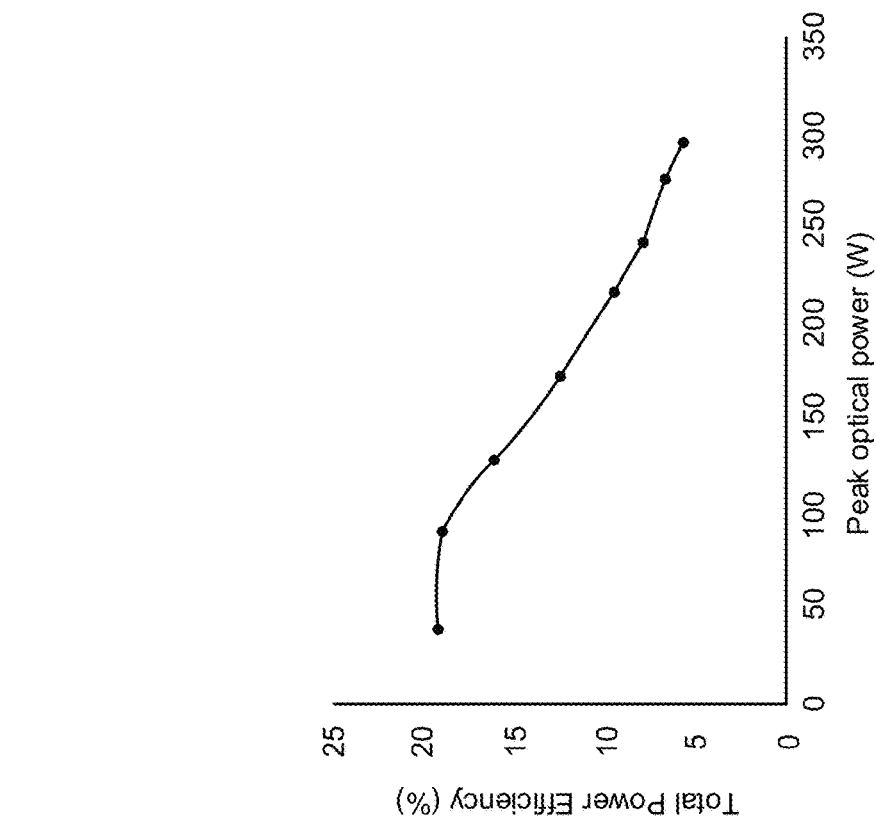
FIG. 10 is a diagram illustrating total power efficiency achieved by the driver circuit using the optical load layout described herein.

FIG. 10 is a diagram 1000 illustrating total power efficiency that can be achieved by the driver circuit 220 using an optical load layout with dual anodes (e.g., the optical load layout 200). As shown in FIG. 10, the total power efficiency provided by the driver circuit 220 may be in a range from approximately 20% to approximately 5% in a range of peak optical power from approximately 40 W to approximately 300 W. Here, the total power efficiency is defined as a ratio of average optical power over a total electrical input power. In some implementations, as noted above, with a voltage source of 4 V, the driver circuit 220 can provide an optical pulse with a 1.87 ns pulse width at 275 W of peak optical power; in such a case, the total power efficiency may be approximately 6%.

As indicated above, FIG. 10 is provided as an example. Other examples may differ from what is described with regard to FIG. 10.

Figure 11:
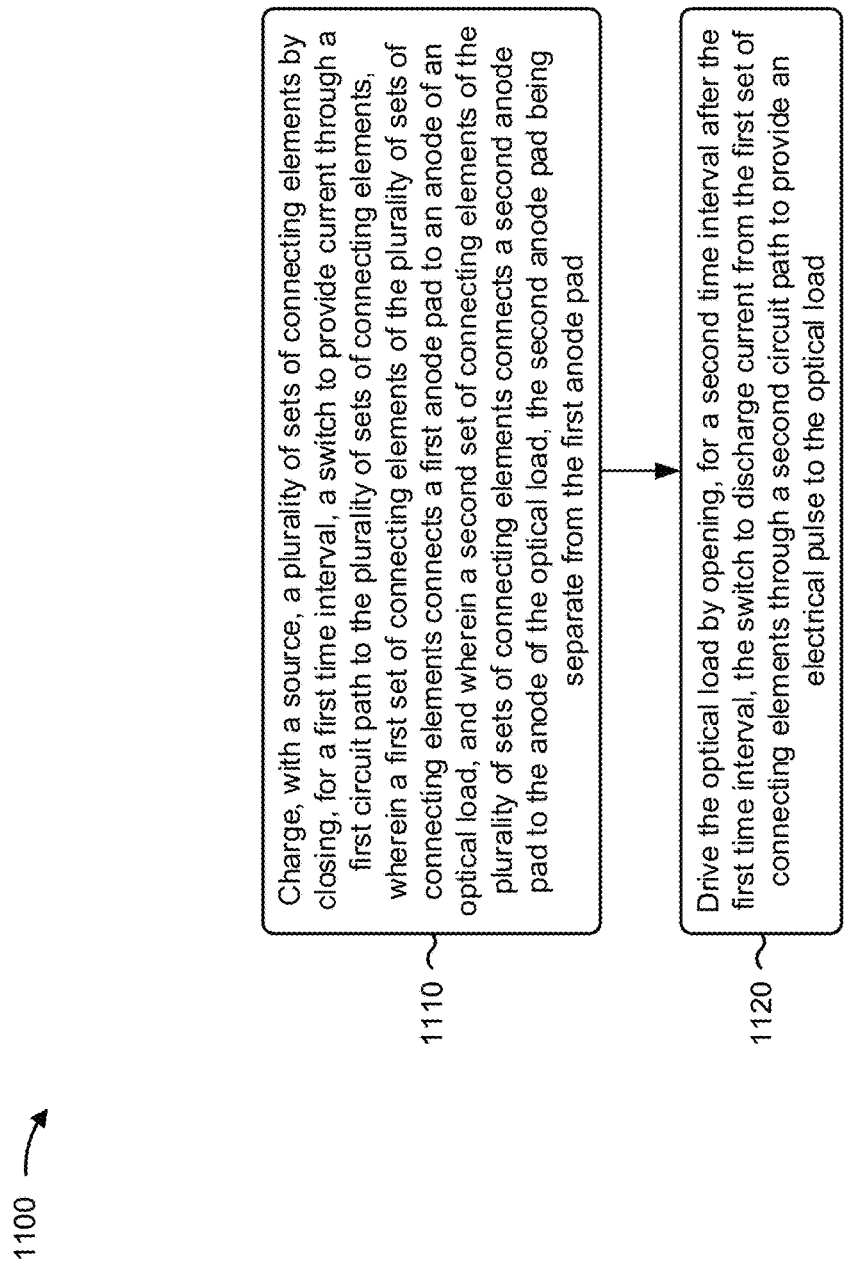
FIG. 11 is a flowchart of an example process relating to driving an optical load using the driver circuit that utilizes the optical load layout described herein.

FIG. 11 is a flowchart of an example process relating to driving an optical load using a driver circuit described herein.

As shown in FIG. 11, process 1100 may include charging, with a source, a plurality of sets of connecting elements by closing, for a first time interval, a switch to provide current through a first circuit path to the plurality of sets of connecting elements (block 1110). For example, a driver circuit (e.g., driver circuit 220) may charge, with a source (e.g., a source 250), a plurality of sets of connecting elements (e.g., wirebonds 206a and 206b) by closing, for a first time interval, a switch (e.g., a switch 256) to provide current through a first circuit path to the plurality of sets of connecting elements, as described above. In some implementations, a first set of connecting elements (e.g., wirebonds 206a) of the plurality of sets of connecting elements connects a first anode pad (e.g., pad 202a) to an anode of an optical load (e.g., an optical load 204). In some implementations, a second set of connecting elements (e.g., wirebonds 206b) of the plurality of sets of connecting elements connects a second anode pad (e.g., pad 202b) to the anode of the optical load. In some implementations, the second anode pad is separate from the first anode pad.

As further shown in FIG. 11, process 1100 may include driving the optical load by opening, for a second time interval after the first time interval, the switch to discharge current from the first set of connecting elements through a second circuit path to provide an electrical pulse to the optical load (block 1120). For example, the driver circuit may drive the optical load by opening, for a second time interval after the first time interval, the switch to discharge current from the first set of connecting elements through a second circuit path to provide an electrical pulse to the optical load, as described above.

Process 1100 may include additional implementations, such as any single implementation or any combination of implementations described below and/or in connection with one or more other processes described elsewhere herein.

In a first implementation, the driving the optical load by opening the switch causes one or more inductive elements to discharge current through the second circuit path to provide the electrical pulse to the optical load.

In a second implementation, alone or in combination with the first implementation, a voltage level of the source is lower than a threshold voltage needed to drive the optical load.

In a third implementation, alone or in combination with one or more of the first and second implementations, a characteristic of the first set of connecting elements is such that an inductance of the first set of connecting elements causes an amount of energy stored by the first set of connecting elements during the charging to satisfy a threshold.

In a fourth implementation, alone or in combination with one or more of the first through third implementations, the switch is an only switch in a driver circuit associated with driving the optical load.

In a fifth implementation, alone or in combination with one or more of the first through fourth implementations, the optical load is a VCSEL chip.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A driver circuit for driving an optical load having an anode and a cathode, the driver circuit comprising:
    a source;
    a ground;
    a first anode pad;
    a first set of connecting elements to connect the first anode pad to the anode of the optical load;
    a second anode pad that is separate from the first anode pad such that the second anode pad is not directly connected to the first anode pad;
    a second set of connecting elements to connect the second anode pad to the anode of the optical load; and
    a switch having an open state and a closed state,
        wherein a first circuit path is connected from the source to the switch and includes, in order:
            the first anode pad,
            the first set of connecting elements,
            the second set of connecting elements, and
            the second anode pad,
                wherein transitioning the switch from the open state to the closed state causes the first set of connecting elements and the second set of connecting elements to be charged through the first circuit path, and
        wherein a second circuit path is to be connected from the source to the optical load and includes, in order:
            the first anode pad, and
            the first set of connecting elements,
                wherein transitioning the switch from the closed state to the open state causes the first set of connecting elements to discharge through the second circuit path to provide an electrical pulse to the optical load.

2. The driver circuit of claim 1, wherein the first circuit path further includes one or more inductive elements, wherein the switch transitioning from the closed state to the open state is further to cause the one or more inductive elements to discharge current through the second circuit path to provide the electrical pulse to the optical load.

3. The driver circuit of claim 1, wherein a voltage level of the source is to be lower than a threshold voltage of the optical load.

4. The driver circuit of claim 1, wherein a characteristic of the first set of connecting elements is such that an inductance of the first set of connecting elements causes an amount of energy stored by the first set of connecting elements when the switch is in the closed state to satisfy a threshold amount of energy.

5. The driver circuit of claim 1, wherein a characteristic of the second set of connecting elements is such that an inductance of the second set of connecting elements causes an amount of energy stored by the second set of connecting elements when the switch is in the closed state to satisfy a threshold amount of energy.

6. The driver circuit of claim 1, wherein the switch is an only switch in the driver circuit associated with driving the optical load.

7. The driver circuit of claim 1, wherein the optical load is a vertical-cavity surface-emitting laser (VCSEL) chip.

8. The driver circuit of claim 7, wherein the VCSEL chip is a multi-junction VCSEL chip.

9. The driver circuit of claim 7, wherein the VCSEL chip includes a plurality of independently addressable zones.

10. An optical package, comprising:
a source;
an optical load to emit light when provided an input current;
a plurality of anode pads, each anode pad of the plurality of anode pads being separate from at least one other anode pad of the plurality of anode pads;
a plurality of sets of connecting elements, each of the plurality of sets of connecting elements connecting a different anode pad of the plurality of anode pads to an anode of the optical load; and
a switch having an open state and a closed state,
wherein a first circuit path is connected from the source to the switch and includes:
the plurality of anode pads, and
the plurality of sets of connecting elements,
wherein transitioning the switch from the open state to the closed state causes the plurality of sets of connecting elements to be charged through the first circuit path, and
wherein a second circuit path is connected from the source to the optical load and includes:
at least one anode pad of the plurality of anode pads, and
at least one set of connecting elements of the plurality of sets of connecting elements,
wherein transitioning the switch from the closed state to the open state causes the at least one set of connecting elements to discharge through the second circuit path to provide an electrical pulse to the optical load.

11. The optical package of claim 10, wherein the first circuit path further includes one or more inductive elements, wherein the switch transitioning from the closed state to the open state is further to cause the one or more inductive elements to discharge current through the second circuit path to provide the electrical pulse to the optical load.

12. The optical package of claim 10, wherein a voltage level of the source prevents current from flowing to the optical load when the switch is in the closed state.

13. The optical package of claim 10, wherein an inductance of the least one set of connecting elements is to cause an amount of energy stored by the first set of connecting elements when the switch is in the closed state to satisfy a threshold amount of energy.

14. The optical package of claim 10, wherein an inductance of at least one other set of connecting elements of the plurality of sets of connecting elements is to cause an amount of energy stored by the at least one other set of connecting elements when the switch is in the closed state to be less than a desired amount of energy.

15. A method, comprising:
charging, with a source, a plurality of sets of connecting elements by closing, for a first time interval, a switch to provide current through a first circuit path to the plurality of sets of connecting elements,
wherein a first set of connecting elements of the plurality of sets of connecting elements connects a first anode pad to an anode of an optical load,
wherein a second set of connecting elements of the plurality of sets of connecting elements connects a second anode pad to the anode of the optical load, the second anode pad being separate from the first anode pad, and
wherein the first circuit path is connected from the source to the switch and includes, in order:
the first anode pad,
the first set of connecting elements,
the second set of connecting elements, and
the second anode pad; and
driving the optical load by opening, for a second time interval after the first time interval, the switch to cause the first set of connecting elements to discharge through a second circuit path to provide an electrical pulse to the optical load,
wherein the second circuit path is connected from the source and to the optical load and includes, in order:
the first anode pad, and
the first set of connecting elements.

16. The method of claim 15, wherein the driving the optical load by opening the switch causes one or more inductive elements to discharge current through the second circuit path to provide the electrical pulse to the optical load.

17. The method of claim 15, wherein a voltage level of the source is lower than a threshold voltage needed to drive the optical load.

18. The method of claim 15, wherein a characteristic of the first set of connecting elements is such that an inductance of the first set of connecting elements causes an amount of energy stored by the first set of connecting elements during the charging to satisfy a threshold voltage of the optical load.

19. The method of claim 15, wherein the switch is an only switch in a driver circuit associated with driving the optical load.

20. The method of claim 15, wherein the optical load is a vertical-cavity surface-emitting laser (VCSEL) chip.

* * * * *